(12) United States Patent
Harnden et al.

(10) Patent No.: US 8,097,945 B2
(45) Date of Patent: Jan. 17, 2012

(54) BI-DIRECTIONAL, REVERSE BLOCKING BATTERY SWITCH

(76) Inventors: James Harnden, Hollister, CA (US); Lynda Harnden, legal representative, Hollister, CA (US); Anthony Chia, Singapore (SG); Liming Wong, Shanghai (CN); Hongbo Yang, Shanghai (CN); Anthony C. Tsui, Saratoga, CA (US); Hui Teng, Shanghai (CN); Ming Zhou, Shanghai (CN)

( * ) Notice: Subject to any disclaimer, the term of this patent is extended or adjusted under 35 U.S.C. 154(b) by 542 days.

(21) Appl. No.: 11/944,116

(22) Filed: Nov. 21, 2007

(65) Prior Publication Data

US 2009/0179265 A1 Jul. 16, 2009

(51) Int. Cl.
| | |
|---|---|
| H01L 23/48 | (2006.01) |
| H01L 29/66 | (2006.01) |
| H01L 23/62 | (2006.01) |
| H01L 23/34 | (2006.01) |
| H01L 23/52 | (2006.01) |
| H01L 29/40 | (2006.01) |
| H01L 21/00 | (2006.01) |
| H01L 21/336 | (2006.01) |

(52) U.S. Cl. ........ 257/697; 257/329; 257/355; 257/696; 257/723; 257/778; 257/787; 257/E23.024; 257/E23.061; 257/E23.116; 257/E23.175; 257/E23.178; 438/126; 438/268

(58) Field of Classification Search .......... None
See application file for complete search history.

(56) References Cited

U.S. PATENT DOCUMENTS

| | | | | |
|---|---|---|---|---|
| 5,003,246 A | * | 3/1991 | Nadd | 323/349 |
| 6,627,991 B1 | * | 9/2003 | Joshi | 257/723 |
| 7,250,672 B2 | * | 7/2007 | Pavier et al. | 257/691 |
| 7,868,432 B2 | * | 1/2011 | Lee et al. | 257/676 |
| 7,880,280 B2 | * | 2/2011 | Otremba | 257/676 |
| 2002/0096748 A1 | * | 7/2002 | Pavier | 257/670 |
| 2004/0021233 A1 | * | 2/2004 | Kinzer et al. | 257/778 |
| 2006/0118818 A1 | * | 6/2006 | Shimoida et al. | 257/183 |
| 2007/0052076 A1 | * | 3/2007 | Ramos et al. | 257/676 |
| 2009/0179265 A1 | * | 7/2009 | Harnden et al. | 257/341 |

FOREIGN PATENT DOCUMENTS

JP          08-032060      *  2/1996

* cited by examiner

*Primary Examiner* — Hoang-Quan Ho
(74) *Attorney, Agent, or Firm* — Kilpatrick Townsend & Stockton LLP

(57) ABSTRACT

Embodiments of the present invention relate to an improved die layout for a bi-directional and reverse blocking battery switch. According to one embodiment, two switches are oriented side-by-side, rather than end-to-end, in a die package. This configuration reduces the total switch resistance for a given die area, often reducing the resistance enough to avoid the use of backmetal in order to meet resistance specifications. Elimination of backmetal reduces the overall cost of the die package and removes the potential failure modes associated with the manufacture of backmetal. Embodiments of the present invention may also allow for more pin connections and an increased pin pitch. This results in redundant connections for higher current connections, thereby reducing electrical and thermal resistance and minimizing the costs of manufacture or implementation of the die package.

17 Claims, 7 Drawing Sheets

--Prior Art--

--Prior Art--

--Prior Art--

--Prior Art--

BI-DIRECTIONAL, REVERSE BLOCKING BATTERY SWITCH

BACKGROUND OF THE INVENTION

Battery life and battery size are two important features of battery powered devices. The goal of each battery charge is to perform "work": powering functions and features that add value, with minimal loss to house-keeping and safety circuits.

When potentially harmful or hazardous conditions arise, the battery may need to be disconnected. To disconnect the battery without reducing battery energy, battery disconnect switches are typically located in series with the battery.

FIG. 1 shows a simplified schematic diagram of a conventional reverse blocking battery switch 100 made up of two N-channel Metal Oxide Semiconductor Field Effect Transistors (MOSFETs) 108 and 109 (shown in FIG. 2). The N-channel MOSFETs include source inputs 101 and 106, and gate inputs 102 and 105.

The N-channel MOSFETs also include respective drains 103 and 104, which are connected by jumper 107. The two MOSFETs of the switch of FIG. 1 may be connected in a "common drain" configuration, utilizing an intrinsic body diode that inherently blocks the flow of current in one direction. Alternative configurations may be used, and other circuitry may be added to protect the various transistor inputs from static damage, or to level-shift the gate inputs 102 and 105.

FIG. 2 shows a perspective view of the mechanical construction of the conventional dual-MOSFET, bi-directional switch configuration of FIG. 1. In this single package solution, common drains 103 and 104 are connected by die-attaching two standard MOSFETs 108 and 109 to a common copper die pad 107. Gates 102 and 105 are formed on the length-wise ends of the package. This configuration achieves both a direct thermal path for heat sinking, and a low electrical resistance connection between the drains 103 and 104, through the backside of vertical conduction MOSFETs 108 and 109.

FIG. 3 shows a simplified perspective view of a monolithic implementation of the conventional bi-directional switch of FIGS. 1-2. This configuration uses two MOSFETs built adjacent and joined to each other on the die pad 307. The MOSFETs are built commonly from two adjacent die 301 and 304 on a normal wafer layout, so the two die 301 and 304 are usually side-by-side, and the gate inputs 302 and 305 lie on the same end of the package. Although relatively easy to construct, the configuration of FIG. 3 does not fit a die package having an aspect ratio that is typically desired by manufacturers.

FIG. 4 shows a bi-directional switch in a 2×5 mm Dual Flat No Lead (DFN) package 400. This version of the bi-directional switch attempts to fit the die into a preferred package footprint. Since the aspect ratio of package 400 is 2×5 mm, the two MOSFETs are attached end-to-end.

However, this configuration renders the internal drain connection resistance high relative to the resistance of the vertical conduction MOSFETs. In order to make the series drain resistance tolerable, the backside of the die is die-attached to a copper die pad. This configuration allows for lower resistance by placing a copper plate (the die pad) in parallel with two bulk drain resistances. The die pad also serves as a common drain connection to external connectors.

While the above configurations are effective, there is a need in the art for a switch having improved characteristics.

BRIEF SUMMARY OF THE INVENTION

Embodiments of the present invention relate to an improved die layout for a bi-directional and reverse blocking battery switch. According to one embodiment, two switches are oriented side-by-side (as opposed to end-to-end) in a die package. This configuration reduces the total switch resistance for a give die area, often reducing the resistance enough to avoid the use of backmetal in order to meet resistance specifications. Elimination of backmetal reduces the overall cost of the die package, and removes the potential failure modes associated with manufacture of backmetal. Embodiments of the present invention also allow for more pin connections and for an increased pin pitch. This allows formation of redundant connections for higher current connections, thereby reducing electrical and thermal resistance, and minimizing the manufacture/implementation costs of the die package.

An embodiment of a semiconductor device in accordance with the present invention, comprises, two vertical MOSFETs in electrical communication through a common drain. A plurality of contacts, which are formed on the top surface of each of the MOSFETs, are in electrical communication with a plurality of pins. A package body is utilized to encapsulate the two MOSFETs and a portion of the plurality of pins. The package body has a first axis and a second axis longer than the first axis, with the contacts of the two MOSFETs oriented along opposite sides of the second axis.

An embodiment of a method for fabricating a reverse blocking battery switch in accordance with the present invention, comprises, providing a two vertical MOSFETs having a common drain connection and a plurality of contacts on the top surface of each transistor, providing a plurality of pins in electrical communication with the contacts of the two MOSFETs, and encapsulating the two MOSFETs and a portion of the pins in package body having a first axis and a second axis longer than the first axis. The contacts of the two MOSFETs are oriented on opposite sides along the second axis of the package body.

An embodiment of a method for packaging a battery switch in accordance with the present invention, comprises, disposing a plurality of pin connection along opposite sides of a first long axis, such that the resistance arising from the distance between two vertical MOSFETs is reduced.

A further understanding of embodiments in accordance with the present invention can be made by way of reference to the ensuing detailed description taken in conjunction with the accompanying drawings.

DETAILED DESCRIPTION OF THE INVENTION

Embodiments of the present invention relate to an improved die layout for a bi-directional and reverse blocking battery switch. According to one embodiment, two switches are integrated in a common bulk Drain, side-by-side (as opposed to end-to-end) in a die package. This configuration reduces the total switch resistance, and often avoids the use of backmetal in order to meet resistance specifications. Elimination of backmetal reduces the overall cost of the die package, and removes the potential failure modes associated with the manufacture of backmetal.

Embodiments of the present invention may also allow for more pin connections and for an increased pin pitch. This results in redundant connections for higher current connections, thereby reducing the electrical and thermal resistance, and minimizing the manufacture/implementation costs of the die package. Embodiments in accordance with the present invention can also exhibit a size and form factor that fits battery cells, a low resistance that will fit in an allowable die footprint, a configuration that provides reliability with the battery assembly and use, and low thermal impedance to sink internally generated heat.

One change that can be made to a conventional die layout, is the use of a "sinker" structure to move the contact with the common drain to the opposite side of the die. Such sinker structures are commonly used to contact the bulk or substrate region in ICs, but they have also found use in power products. Since power products generally need low resistance connections to all nodes, a sinker would consume a large area in order to have comparable resistance to an active device.

Figure 5A:
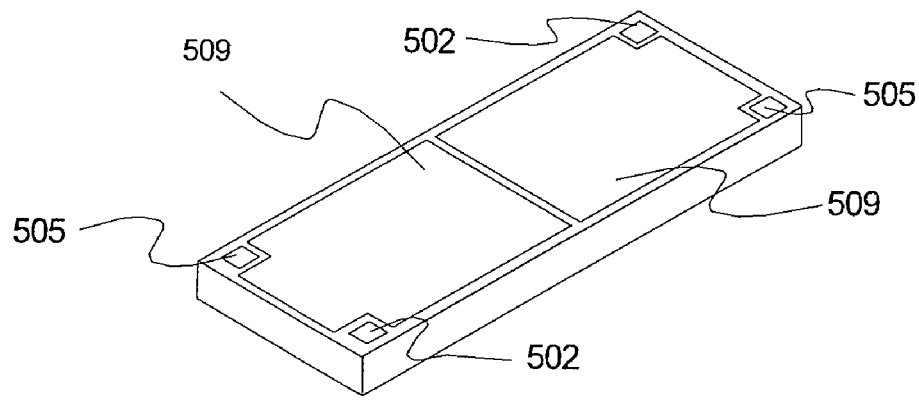
FIG. 5A shows a simplified perspective view of a monolithic bi-directional switch with a "sinker" connected to a common drain.
Figure 5B:
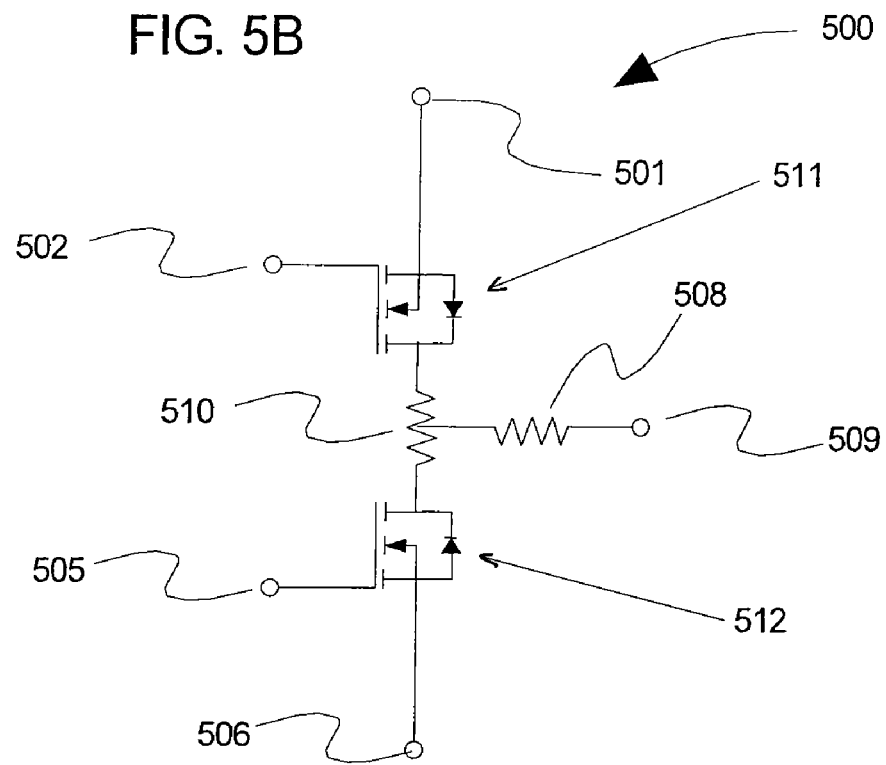
FIG. 5B shows a simplified electrical schematic of the package of FIG. 5A.

FIGS. 5A and 5B illustrate perspective and circuit schematic views respectively, or such a configuration, where a monolithic bi-directional switch 500 has a "sinker" to a common drain connection. Resistance 510 is the series resistance of the common drain connection that connects the two vertical MOSFETs 511 and 512, which include gate inputs 502 and 505, and source inputs 501 and 506.

The common drain connection is achieved by integrating two devices in a conductive common "bulk" drain area on the wafer. Though the common "bulk" drain area is conductive, the series resistance is not as low as the series resistance of a package using backmetal.

Moreover, resistor 508 represents the series resistance of the "sinker", which is in series with an outside node 509 and directly in series with the two MOSFET switches 511 and 512. In most cases, this node is used to monitor the voltage of the common drain connection, which is not a high current path that can cause significant inaccuracies even if a sinker of minimal area is employed.

The conventional arrangement utilizing a sinker structure shown in FIGS. 5A and 5B, allows all of the contacts of the package pins and external connectors to be made on one side of the die. In this configuration, however, the drain region has low resistance between the two active vertical MOSFETs, and the common drain area does not yield a high external current connection. Moreover, the drain connection is primarily used to monitor the voltage, which can tolerate large series resistance without corrupting the readings.

Other conventional methods exist to position the drain connection to the same side as the gate and source, such as drilling, etching, and/or plating or filling the hole with copper, solder, or a tri-metal similar to that used on the backside of a MOSFET wafer. However, these methods may not be cost effective, especially for an application that does not require extremely low resistance for the common drain connection to external connectors.

Figure 6A:
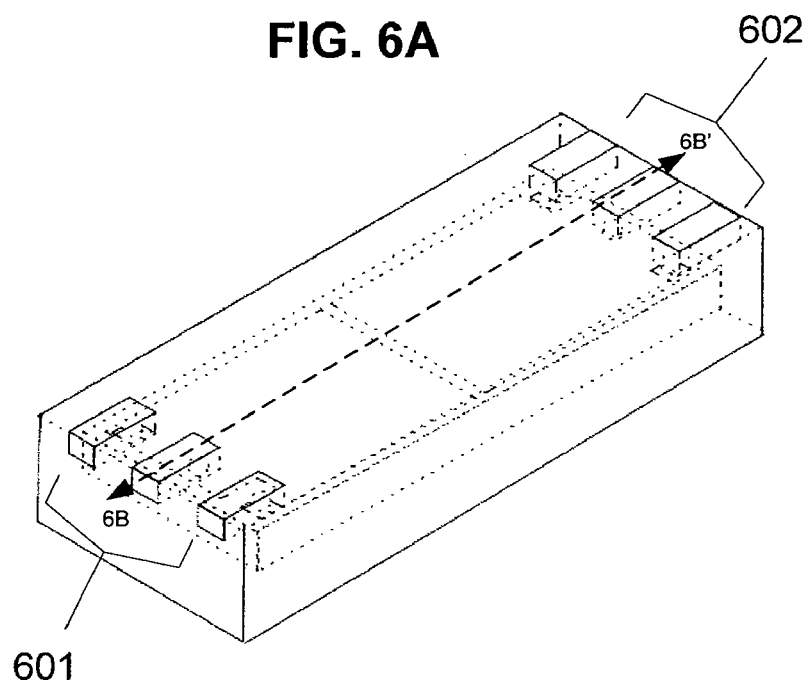
FIG. 6A shows a simplified perspective view of a bump on leadframe implementation of a monolithic bi-directional switch in 2×5 mm Dual Flat No Lead package.
Figure 6B:
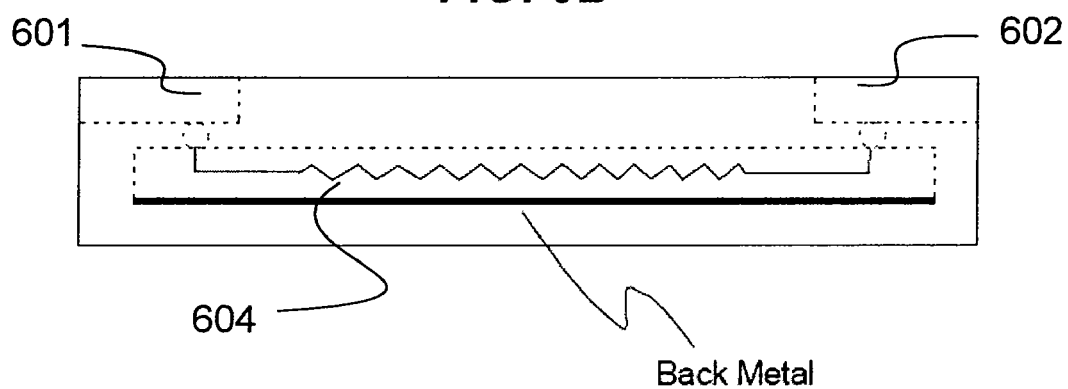
FIG. 6B shows a simplified side view of the package of FIG. 6A.

FIG. 6A is a simplified perspective view, and FIG. 6B is a side view, of an implementation of a conventional bump on leadframe ("BOL") of the monolithic bi-directional switch of FIGS. 5A and 5B, packaged in an existing 2×5 mm DFN package. Though this arrangement can be connected via an existing 2×5 mm DFN style package, this configuration is not a significant improvement over existing products.

Specifically, the die layout of the embodiment of FIGS. 6A and 6B still positions the two MOSFET switches 601 and 602 end-to-end. This maximizes and distributes the series drain resistance 604 common to the two switches 601 and 602, thereby increasing the total resistance and necessitating addition of backmetal, a copper slug, or some other low resistance parallel conduction layer. In addition, the package contact layout at the two ends forces the die contacts for external connectors, to be routed to the ends of the die, an inefficient use of die area.

Figure 7A:
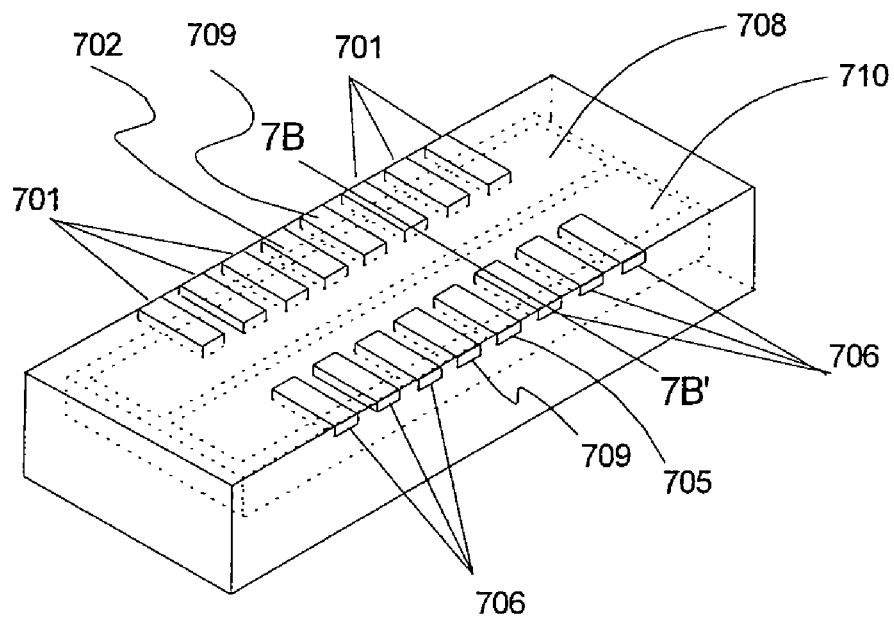
FIG. 7A shows a simplified perspective view of an improved die layout according to an embodiment of the present invention.
Figure 7B:
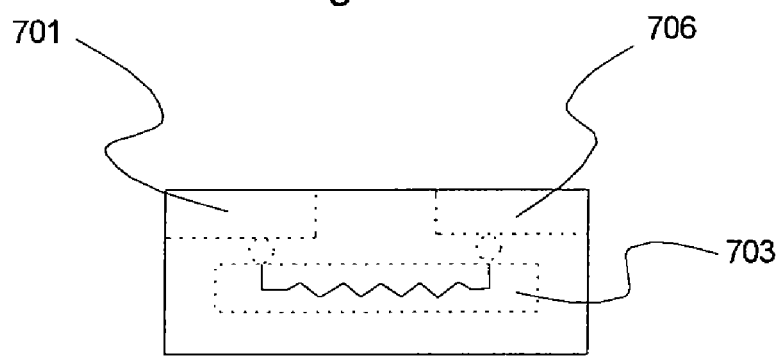
FIG. 7B shows a simplified cross-section view of the improved die layout of FIG. 7A.
Figure 7C:
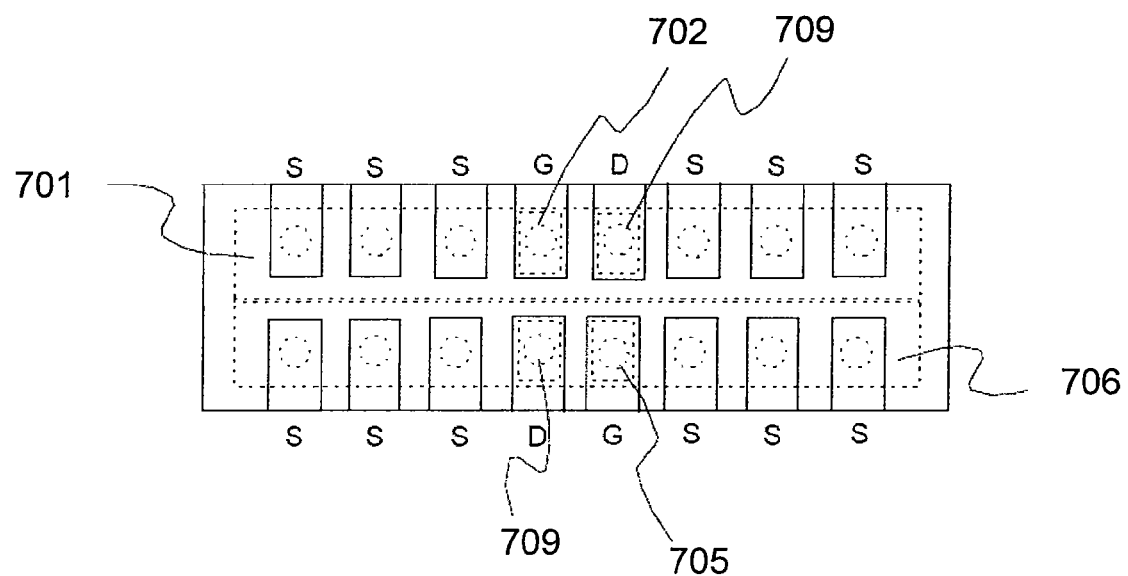
FIG. 7C shows a simplified bottom view of the improved die layout of FIG. 7A.

Accordingly, FIG. 7A is a simplified perspective view, FIG. 7B a simplified end view, and FIG. 7C a simplified bottom view, of an embodiment die layout according to the present invention. In this embodiment, the die is laid out so that the two switches 708 and 710 occupy the same overall die area as in the package of FIG. 6A, but are oriented side-by-side instead of end to end. The die package according to embodiments of the present invention can be built using a DFN, ChipScale, or even J-lead technology. The two switches 708 and 710 include respective gate inputs 702 and 705, source inputs 701 and 706, and common drain connection 709 (i.e. the common "bulk" drain).

FIG. 7B is a simplified schematic view from the end of the die layout of FIG. 7A. FIG. 7B shows that the series drain resistance 703, is smaller than the series drain resistance 604 of the conventional arrangement shown in FIG. 6B. Specifically, with everything else remaining the same, the configuration of the embodiments of FIGS. 7A-C will reduce total resistance of the blocking battery switch by a factor of the length times width ratio. Here, the length times width ratio is half the length and twice the width (two squares in series vs. two squares in parallel), or one-fourth the total switch resistance.

The reduction in series drain and source resistance achieved by embodiments in accordance with the present invention, may in turn sufficiently reduce the drain bulk resistance, to avoid having to use backmetal in order to meet the resistance specification limits. Such elimination of backmetal reduces the costs and potential failure modes associated with backmetal manufacturing.

Ultimately, embodiments of the present invention may allow for more and/or wider pins, and increased pin pitch. This allows redundant connections to be provided for the higher current connections. The wider and increased number of pins, may also help to reduce electrical and thermal resistance, and help to prevent marginal connections from being catastrophic. Additionally, die packages that do not push the limits on pin pitch, tend to be less expensive to implement and manufacture.

Figure 1:
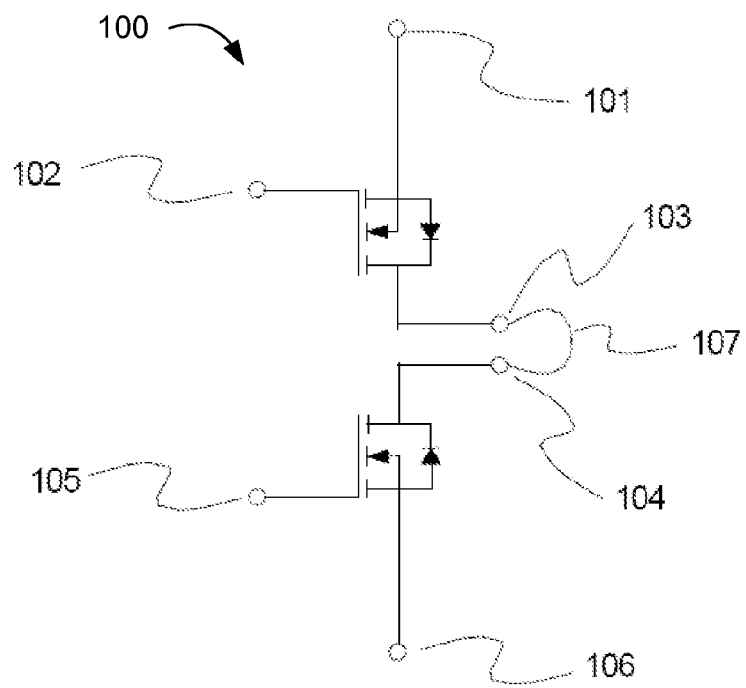
FIG. 1 shows a simplified circuit schematic of a conventional reverse blocking battery switch made up of two ordinary N-channel MOSFETs.
Figure 2:
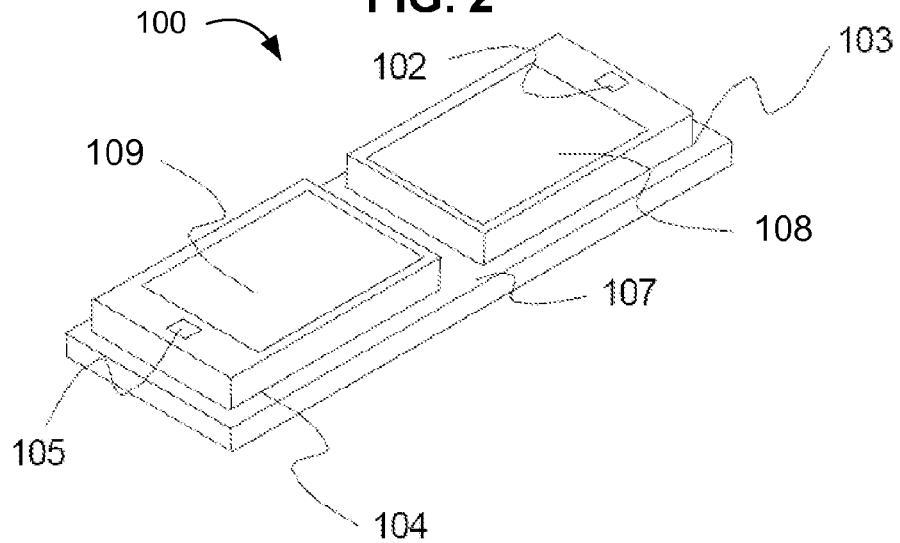
FIG. 2 shows a simplified perspective view of a conventional MOSFET attachment in a dual-MOSFET, bi-directional switch configuration.
Figure 3:
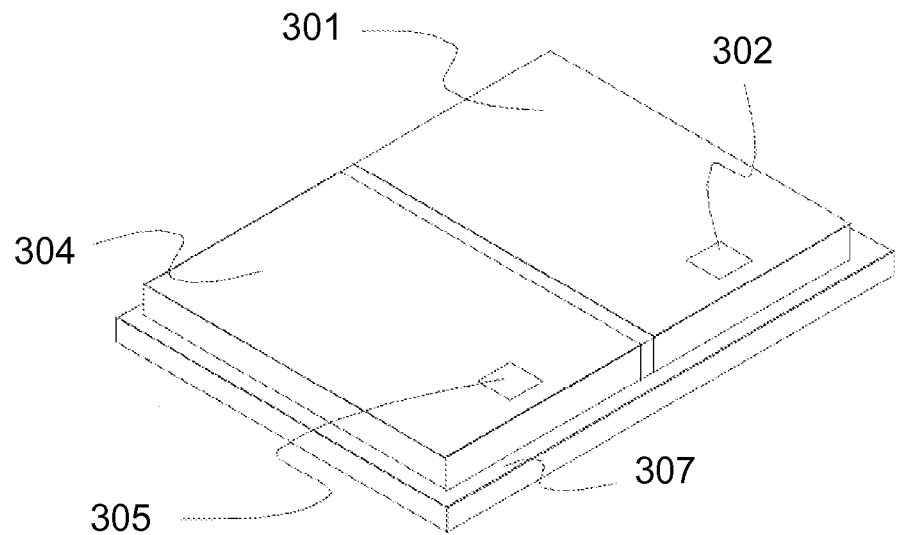
FIG. 3 shows a simplified perspective view of a monolithic implementation of a conventional bi-directional switch configuration.
Figure 4:
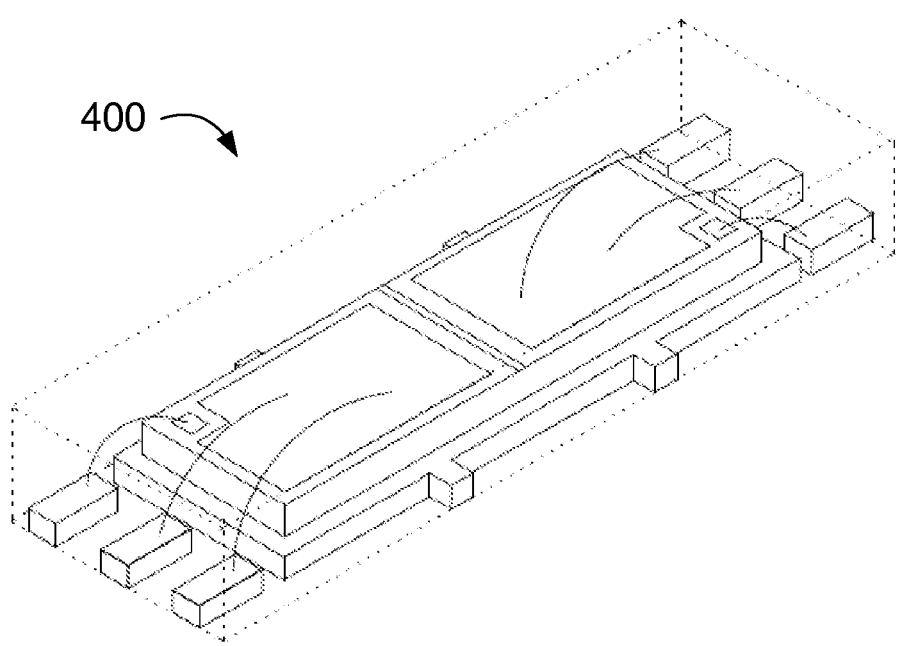
FIG. 4 shows a simplified perspective view of a conventional bi-directional switch in a 2×5 mm Dual Flat No Lead package.
Figure 7D:
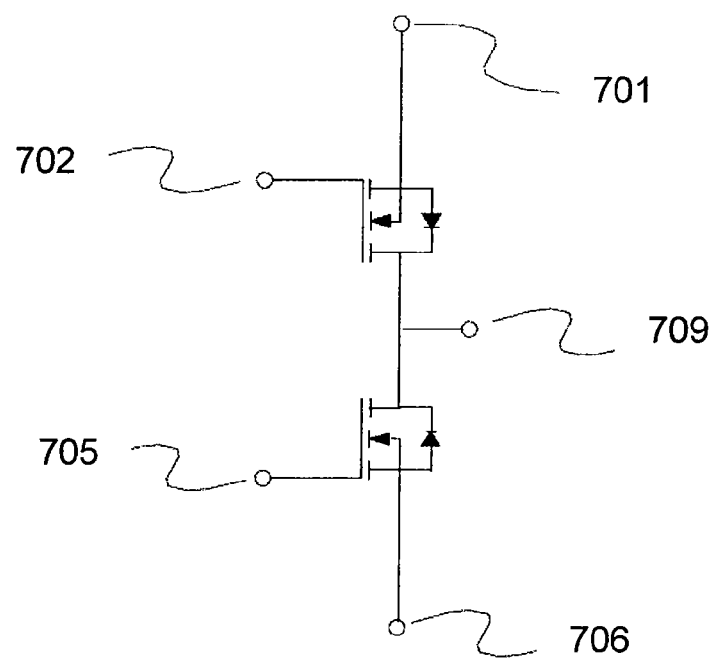
FIG. 7D show a simplified electrical schematic of the improved die layout of FIG. 7A.

FIG. 7D shows a simplified electrical schematic of the improved die layout of the embodiment of FIGS. 7A-7C. Unlike the conventional die package of FIG. 1, the common drain area of FIG. 7D does not require a jumper to connect two common drains. Moreover, the pins are oriented so that the same pin pattern is repeated on either side, for either switch, thereby making the die package reversible. Such an arrangement removes an orientation step during testing of the package, and during assembly of the package on the PC board.

Figure 8A:
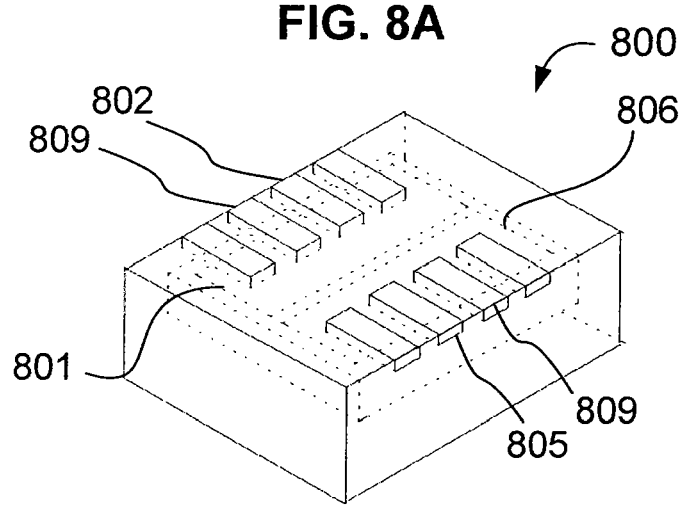
FIG. 8A is a simplified perspective view of a higher resistance switch on a smaller die layout according to an embodiment of the present invention.
Figure 8B:
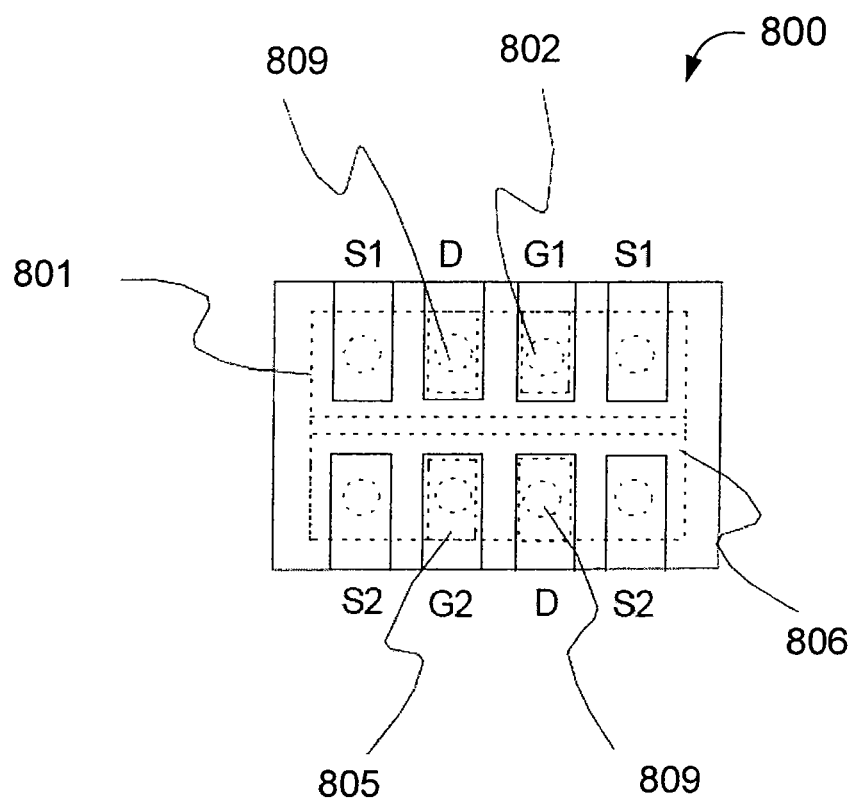
FIG. 8B is a simplified bottom view of the die layout of FIG. 8A.

FIG. 8A is simplified perspective view, and FIG. 8B is a top view, of a smaller, higher resistance switch 800 according to an alternative embodiment of the present invention. The switch of FIGS. 8A and 8B is positioned on a smaller die layout.

By locating the gate connections 802 and 805 and the common drain connections 809 at the center of the package, and then reversing them side-to-side, the package becomes reversible. Thus, if the package is turned 180 degrees, the gate, source, and drain connections would remain in the same place along each side of the package.

Moreover, the number of source connections 801 and 806 on either end is a function of the die size, and therefore a ratio of the switch resistance. Accordingly, the embodiment of FIGS. 8A-8B reduces thermal and electrical resistance, and allows for efficient use of the die area.

While the above is a full description of the specific embodiments in accordance with the present invention, various modifications, and alternative constructions and equivalents may be used. For example, while the embodiments shown in FIGS. 7A-8B utilize MOSFETs present in a monolithic structure, this is not required by the present invention. According to alternative embodiments, the MOSFETs of the switch could be present in discrete die. In such embodiments, a common drain between the MOSFET devices of the adjacent die could be established through a backmetal or other conducting layer such as a die pad.

In view of the above, the description and illustrations should not be taken as limiting the scope of the present invention which is defined by the appended claims.

What is claimed is:

1. A semiconductor device comprising:
a first vertical MOSFET having a drain in electrical communication with a drain of a second vertical MOSFET, the first and second vertical MOSFETs having a plurality of contacts on respective top surfaces, wherein each top surface includes at least one contact for each of:
the drain,
a gate, and
a source of the respective vertical MOSFET;
a plurality of pins in electrical communication with the contacts; and
a package body encapsulating the transistors and a portion of the pins, the package body having an outer surface parallel to the top surfaces of the vertical MOSFETs wherein:
the outer surface has a first dimension and a second dimension longer than the first dimension, and
a first subset of pins in electrical communication with the contacts of the first vertical MOSFET and a second subset of pins in electrical communication with the contacts of the second vertical MOSFET are disposed along a length of the second dimension on opposite sides of the package body.

2. The semiconductor device of claim 1 wherein the first and second vertical MOSFETs are provided monolithically in a single substrate.

3. The semiconductor device of claim 1 wherein the first and second vertical MOSFETs are provided as separate die.

4. The semiconductor device of claim 1 wherein the package body confirms to a specification selected from DFN, ChipScale, or J-lead.

5. The semiconductor device of claim 1 wherein the contacts of the first vertical MOSFET and of the second vertical MOSFET are connected to form a reverse blocking battery switch.

6. The semiconductor device of claim 1 wherein the first subset of pins are disposed in the package body to be electrically symmetrical with respect to the second subset of pins, if the package body is turned 180 degrees.

7. The semiconductor device of claim 1 wherein the drains of the first and second vertical MOSFETs are not electrically connected through a backmetal.

8. The semiconductor device of claim 1 wherein the first and second vertical MOSFETs are electrically connected through a backmetal.

9. The semiconductor device of claim 1 wherein surfaces of one of the first vertical MOSFET or the second vertical MOSFET exhibit a plurality of gate or source contacts.

10. A method of fabricating a reverse blocking battery switch, the method comprising:
providing a first vertical MOSFET having a drain in electrical communication with a drain of a second vertical MOSFET, the first and second vertical MOSFETs having a plurality of contacts on respective top surfaces, wherein each top surface includes at least one contact for each of:
the drain,
a gate, and
a source of the respective vertical MOSFET;
providing a plurality of pins in electrical communication with the contacts; and
encapsulating the first and second vertical MOSFETs and a portion of the pins in a package body having an outer surface parallel to the top surfaces of the vertical MOSFETs wherein:
the outer surface has a first dimension and a second dimension longer than the first dimension, and
a first subset of pins in electrical communication with the contacts of the first vertical MOSFET and a second subset of pins in electrical communication with the contacts of the second vertical MOSFET are disposed along a length of the second dimension on opposite sides of the package body.

11. The method of claim 10 wherein the first and second vertical MOSFETs are provided monolithically in a single substrate.

12. The method of claim 10 wherein the first and second vertical MOSFETs are provided as separate die.

13. The method of claim 10 wherein the contacts of the first vertical MOSFET and of the second vertical MOSFET are connected by the pins to form a reverse blocking switch.

14. The method of claim 10 wherein the encapsulating results in a package conforming to a specification selected from DFN, ChipScale, or J-lead.

15. The method of claim 10 wherein the first subset of pins are disposed in the package body to be electrically symmetrical with respect to the second subset of pins if the package body is turned 180 degrees.

16. The method of claim 10 wherein drains of the first and second vertical MOSFETs are in electronic communication through a backmetal.

17. The method of claim 10 wherein the pins are provided to surfaces of one of the first vertical MOSFET or the second vertical MOSFET bearing a plurality of gate or source contacts.

* * * * *